(12) United States Patent
Ali et al.

(10) Patent No.: US 11,889,701 B2
(45) Date of Patent: Jan. 30, 2024

(54) MEMORY CELL INCLUDING POLARIZATION RETENTION MEMBER(S) INCLUDING ANTIFERROELECTRIC LAYER OVER FERROELECTRIC LAYER

(71) Applicant: GLOBALFOUNDRIES Dresden Module One Limited Liability Company & Co. KG, Dresden (DE)

(72) Inventors: Tarek Ali, Dresden (DE); Konstantin H. J. Mertens, Dresden (DE); Maximilian W. Lederer, Dresden (DE); David J. Lehninger, Dresden (DE); Konrad Seidel, Dresden (DE)

(73) Assignee: GlobalFoundries U.S. Inc., Santa Clara, CA (US)

( * ) Notice: Subject to any disclaimer, the term of this patent is extended or adjusted under 35 U.S.C. 154(b) by 295 days.

(21) Appl. No.: 17/237,886

(22) Filed: Apr. 22, 2021

(65) Prior Publication Data

US 2022/0344359 A1 Oct. 27, 2022

(51) Int. Cl.
*H01L 21/00* (2006.01)
*H10B 53/30* (2023.01)
(Continued)

(52) U.S. Cl.
CPC ............ *H10B 53/30* (2023.02); *H01L 28/60* (2013.01); *H01L 29/516* (2013.01); *H01L 29/78391* (2014.09); *H10B 51/30* (2023.02)

(58) Field of Classification Search
CPC ... H10B 53/30; H10B 51/30; H01L 29/78391; H01L 28/60; H01L 29/516
See application file for complete search history.

(56) References Cited

U.S. PATENT DOCUMENTS 5,555,219 A 9/1996 Akiyama et al.
10,872,966 B1 12/2020 Cheng
(Continued)

FOREIGN PATENT DOCUMENTS

JP 61229350 A 10/1986
KR 19990073671 A 10/1999
(Continued)

OTHER PUBLICATIONS

Lederer et al., "Impact of the SiO2 interface layer on the crystallographic texture of ferroelectric hafnium oxide", Appl. Phys. Lett. 118, 012901, 2021, pp. 1-5.

*Primary Examiner* — Richard A Booth
(74) *Attorney, Agent, or Firm* — Yee Tze Lim; Hoffman Warnick LLC (57) ABSTRACT

Memory cells include various versions of a capacitor structure including a polarization retention member. Each polarization retention member includes an antiferroelectric layer over a ferroelectric layer. The antiferroelectric layer, among other layers, can be tailored to customize the hysteresis loop shape, and the coercive electric field required to change polarization of the memory cell. Metal electrodes, and/or dielectric or metallic interlayers may also be employed to tailor the hysteresis. The memory cells can include FeRAMs or FeFETs. The memory cells provide a lower coercive electric field requirement compared to conventional ferroelectric memory cells, enhanced reliability, and require minimum changes to integrate into current integrated circuit fabrication processes.

20 Claims, 5 Drawing Sheets

(51) Int. Cl.
*H01L 49/02* (2006.01)
*H01L 29/78* (2006.01)
*H01L 29/51* (2006.01)
*H10B 51/30* (2023.01)

(56) References Cited

U.S. PATENT DOCUMENTS

| | | |
|---|---|---|
| 2011/0309330 A1 | 12/2011 | Ohnesorge |
| 2016/0057884 A1 | 2/2016 | Mao |
| 2017/0256552 A1 | 9/2017 | Schroder et al. |
| 2018/0366476 A1 | 12/2018 | Liu |
| 2021/0005733 A1 | 1/2021 | Cheng |
| 2021/0399135 A1* | 12/2021 | Polakowski ........... H10B 53/30 |

FOREIGN PATENT DOCUMENTS

| | | |
|---|---|---|
| KR | 100277846 B1 | 2/2001 |
| WO | 2009128133 A1 | 10/2009 |

* cited by examiner

MEMORY CELL INCLUDING POLARIZATION RETENTION MEMBER(S) INCLUDING ANTIFERROELECTRIC LAYER OVER FERROELECTRIC LAYER

BACKGROUND

The present disclosure relates to memory devices, and more specifically, to memory cells including polarization retention member(s) including an antiferroelectric layer over a ferroelectric layer.

Memory devices are used in a wide variety of electronic devices. One form of memory device includes random access memory (RAM) cells, which typically include a transistor operatively coupled to a capacitor structure. The capacitor structure in a ferroelectric RAM (FeRAM) uses ferroelectric material between two metal electrodes, instead of a dielectric. Similarly, a ferroelectric field effect transistor (FeFET) memory cell uses a ferroelectric material sandwiched between a metal electrode and a semiconductor, i.e., in a gate stack of the transistor. Ferroelectric materials include crystalline insulators capable of permanent electrical polarization by application of an electric field. Ferroelectric memory devices are advantageous because they exhibit, for example, high access speed, low-density requirements, low power usage, low volatility and very high read/write endurance.

Figure 1:
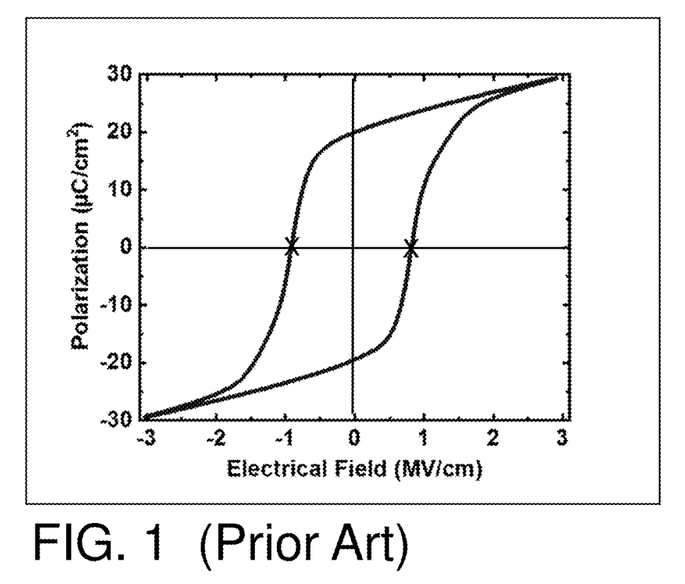
FIG. 1 shows an illustrative graph of a prior art ferroelectric polarization-electric field (PE) hysteresis loop.

Conventional memory cell capacitor structures use dielectrics that exhibit a polarization that is linearly related to the applied external field, i.e., they exhibit linear direct polarization. In contrast, ferroelectric materials exhibit electric permittivity that is not constant as a function of the applied electric field. In addition, ferroelectric materials exhibit a non-zero polarization, also known as the remnant polarization, even with no electric field applied thereto. The polarization can be reversed by application of a sufficiently strong, opposite electrical field. Consequently, the polarization of a ferroelectric memory cell at any time is not just dependent on the applied electric field, but also a prior electric field. As shown in FIG. 1, the relationship creates a polarization-electric field (PE) hysteresis loop.

One challenge for FeRAM and FeFET memory cells is controlling the ferroelectric hysteresis shape and properties. Notably, a high electric field (referred to as a coercive electric field) is required to force a change in polarization. See, for example, the polarization change electric field values at the "X" locations in FIG. 1, which are +/−1 mega-Volt/centimeter (MV/cm). The required coercive electric field (voltage) can be close to levels at which the ferroelectric material breaks down, creating a reliability issue. Currently, tuning the ferroelectric materials to control the hysteresis loop is provided by controlling the material deposition process to attain certain properties. This approach has limited effectiveness.

SUMMARY

An aspect of the disclosure is directed to a memory cell, comprising: a capacitor structure including: a first electrode; at least a pair of polarization retention members over the first electrode, each polarization retention member including an antiferroelectric layer over and in contact with a ferroelectric layer; and a first metal electrode over and in contact with an uppermost one of the antiferroelectric layer.

Another aspect of the disclosure includes a memory cell, comprising: a first electrode; at least one polarization retention member over the first electrode, each polarization retention member including an antiferroelectric layer over and in contact with an interlayer over and in contact with a ferroelectric layer; and a first metal electrode over and in contact with an uppermost one of the antiferroelectric layer.

An aspect of the disclosure related to a ferroelectric field effect transistor (FeFET), comprising: a source region and a drain region in a semiconductor substrate; a gate stack including: a first insulator layer over and in contact with the semiconductor substrate between the source region and the drain region; at least one polarization retention member over the first insulator layer, each polarization retention member including an uppermost antiferroelectric layer, a ferroelectric layer and a first metal electrode; and a second metal electrode over and in contact with the uppermost antiferroelectric layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following: "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide memory cells including various versions of a capacitor structure including a polarization retention member. Each polarization retention member includes an antiferroelectric layer over at least a ferroelectric layer. The antiferroelectric layer, among other layers, can be tailored to customize the hysteresis loop shape, and among other things, the coercive electric field strength required to change polarization of the memory cell. As will be described, the memory cells can include FeRAMs or FeFETs. The memory cells provide a lower coercive electric field strength requirement compared to conventional ferroelectric memory cells, enhanced reliability, and require few changes to integrate into current integrated circuit fabrication processes.

As used herein, "ferroelectric layer" may include any dielectric material that exhibits permanent electric polarization that varies in strength with applied electric field. Ferroelectric materials exhibit electric permittivity that is not constant as a function of the applied electric field. Ferroelectric materials include a crystalline array of electric dipoles (based on electrons and ions therein) with adjacent dipoles oriented in the same (parallel) directions. Ferroelectric materials may include any fluorite- or perovskite-structure having ferroelectric characteristics such as but not limited to: hafnium oxide ($HfO_2$), zirconium oxide ($ZrO_2$), hafnium zirconium oxide ($Hf_{0.5}Zr_{0.5}O_2$), lead zirconate titanate ($PbZr/TiO_3$)(PZT), barium titanate ($BaTiO_3$)(BTO), lead(II) titanate ($PbTiO_3$), other ferroelectric transition metal oxides, or combinations thereof. The ferroelectric material may be doped with, for example, silicon (Si), aluminum (Al), lanthanum (La), nitrogen (N), strontium (Sr), gadolinium (Gd) and/or yttrium (Y).

As used herein, an "antiferroelectric layer" may include: a) antiferroelectric material including any material including a crystalline array of electric dipoles (based on electrons and ions therein), but with adjacent dipoles oriented in opposite (anti-parallel) directions, and/or b) antiferroelectric-like material that exhibits characteristics of an antiferroelectric material, but is not an antiferroelectric material. With antiferroelectric material, unlike a ferroelectric material, there is no natural polarization because the adjacent dipoles cancel one another. Antiferroelectric material may include but are not limited to the same materials as the ferroelectric materials listed herein, but with different properties. However, the ferroelectric layer and antiferroelectric layer are different in some way. According to embodiments of the disclosure, a wide variety of parameters of the ferroelectric layer(s) and/or the antiferroelectric layer(s), among other layers, in a polarization retention member can be adjusted to tailor the operation of the memory cell in which included. For example, a type of material (e.g., hafnium oxide or PZT), type of dopant, a dopant concentration, a thickness, and/or a mechanical stress of each layer in the capacitor structure can be adjusted. For example, the antiferroelectric layer may include at least one of: a higher dopant concentration than the ferroelectric layer; a higher mechanical stress than the ferroelectric layer; a thinner thickness than the ferroelectric layer; and where the ferroelectric layer includes zirconium, a higher zirconium (Zr) content than the ferroelectric layer.

Figure 2:
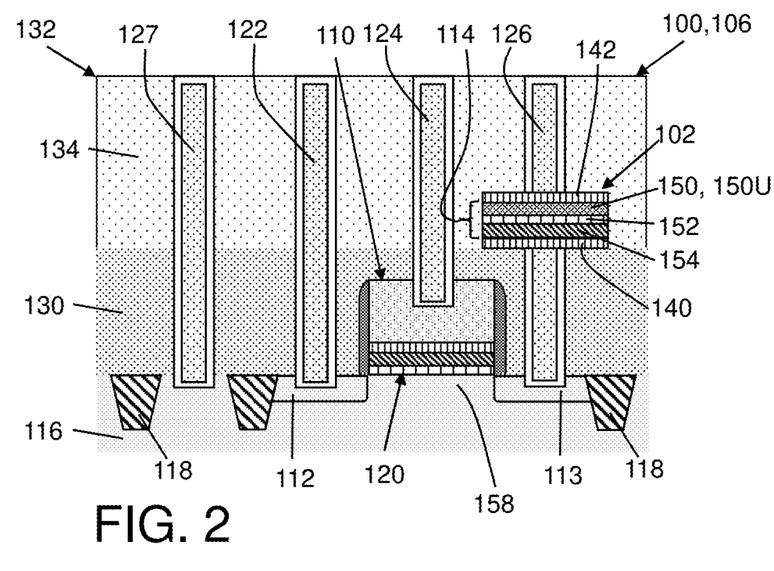
FIG. 2 shows a cross-sectional view of a memory cell in the form of a ferroelectric random access memory (FeRAM) including at least one polarization retention member including an antiferroelectric layer over an interlayer over a ferroelectric layer, according to embodiments of the disclosure.
Figure 3:
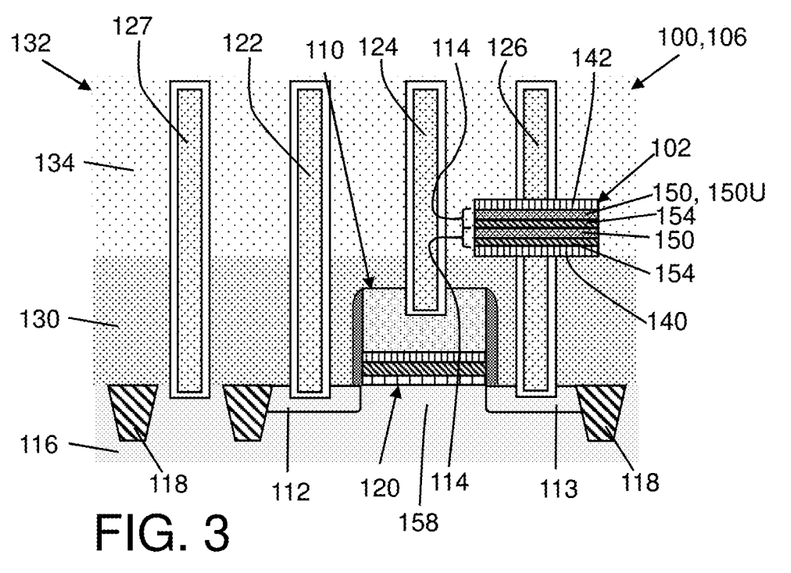
FIG. 3 shows a cross-sectional view of a memory cell in the form of a FeRAM including at least a pair of polarization retention members, each including an antiferroelectric layer over a ferroelectric layer, according to embodiments of the disclosure.

FIGS. 2-8 show cross-sectional views of a memory cell 100 according to embodiments of the disclosure. As understood in the art, a number of memory cells 100 may be operatively coupled together to form a memory device such as a RAM. As ways to join memory cells are well known and can vary, no further description is warranted. Generally, memory cell 100 may include a capacitor structure 102 including a first, lower electrode 140, a second, upper metal electrode 142, and at least one polarization retention member 114. FIGS. 2 and 3 show embodiments in which memory cell 100 takes the form of a FeRAM 106, and FIGS. 4-8 show embodiments in which memory cell 100 takes the form of a FeFET 108.

As shown in FIGS. 2-3, memory cell 100 in the form of a FeRAM 106 may include a control transistor 110 coupled to capacitor structure 102. Control transistor 110 may include any now known or later developed transistor structure for use with capacitor structure 102. Control transistor 110 may include, for example, source/drain regions 112, 113 formed within a semiconductor substrate 116 (hereinafter "substrate 116"), such as a silicon substrate. Trench isolations 118 may separate parts of memory cell 100 from each other or from other memory cells. Over a surface of substrate 116, a metal gate 120 is formed, which extends between source region 112 and drain region 113. Metal gate 120 may include any now known or later developed metal gate structure such as but not limited to: gate dielectric layer(s) such as a high-K layer (e.g., hafnium oxide) and/or an insulator interface layer (e.g., silicon dioxide), work function metal(s), gate conductor(s), and adjacent spacer(s). Metal gate 120 is over a channel region 158 between source region 112 and drain region 113. A bit line 122 is formed on top of source region 112, and a word line 124 is formed on top of metal gate 120. A plate line 126 couples to one electrode of capacitor structure 102, and couples another electrode of capacitor structure to drain region 113. A well contact 127 is also shown.

As illustrated, FeRAM 106 may include control transistor 110 in a front-end-of-line (FEOL) dielectric layer(s) 130 of an integrated circuit (IC) 132, and capacitor structure 102 in any back-end-of-line (BEOL) interlayer dielectric (ILD) layer(s) 134 of IC 132. Dielectric layers 130, 134 may include any now known or later developed dielectric appropriate for the particular layers. For example, dielectric layers 130, 134 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. The various contacts, e.g., bit line 122, word line 124, plate line 126 and well contact 127, may include any now known or later developed contact structure such as but not limited to a refractory metal liner filled with a conductor such as tungsten. As the formation of control transistor 110 and the contacts is well known, no further details of their formation is warranted.

As noted, capacitor structure 102 in accordance with various embodiments described herein is coupled to drain region 113. Capacitor structure 102 may include a stacked structure including a lower electrode 140, an upper metal electrode 142, and at least one polarization retention member 114 therebetween. In FIGS. 2 and 3, lower electrode 140 may be metal. Here, lower electrode 140 and upper metal electrode 142 may include any conductor typically employed for a capacitor structure such as but not limited to copper or aluminum.

With reference to FIGS. 4-8, in certain embodiments, memory cell 100 may include a FeFET 108. In these situations, lower electrode 140 includes channel region 158 between source region 112 and drain region 113 in substrate 116. Here, polarization retention member(s) 114 is/are part of a gate stack 160, 260 over an insulator layer 162. Insulator layer 162 is over and in contact with channel region 158. Insulator layer 162 may include any now known or later developed gate dielectric layer(s) such as but not limited to: silicon oxide ($SiO_2$), silicon oxynitride (SiON), silicon nitride (SiN), aluminum oxide ($Al_2O_3$), hafnon ($HfSiO_4$), or other oxide based insulators.

Figure 4:
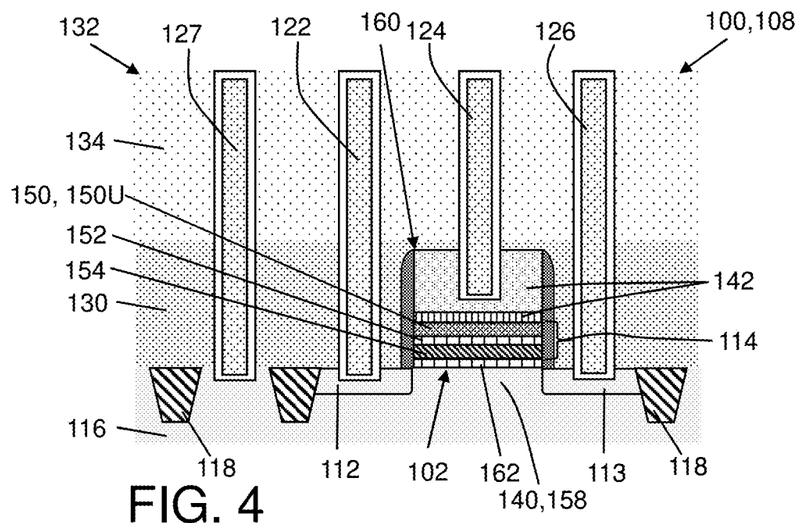
FIG. 4 shows a cross-sectional view of a memory cell in the form of a ferroelectric field effect transistor (FeFET) including at least one polarization retention member including an antiferroelectric layer over an interlayer over a ferroelectric layer, according to embodiments of the disclosure.
Figure 5:
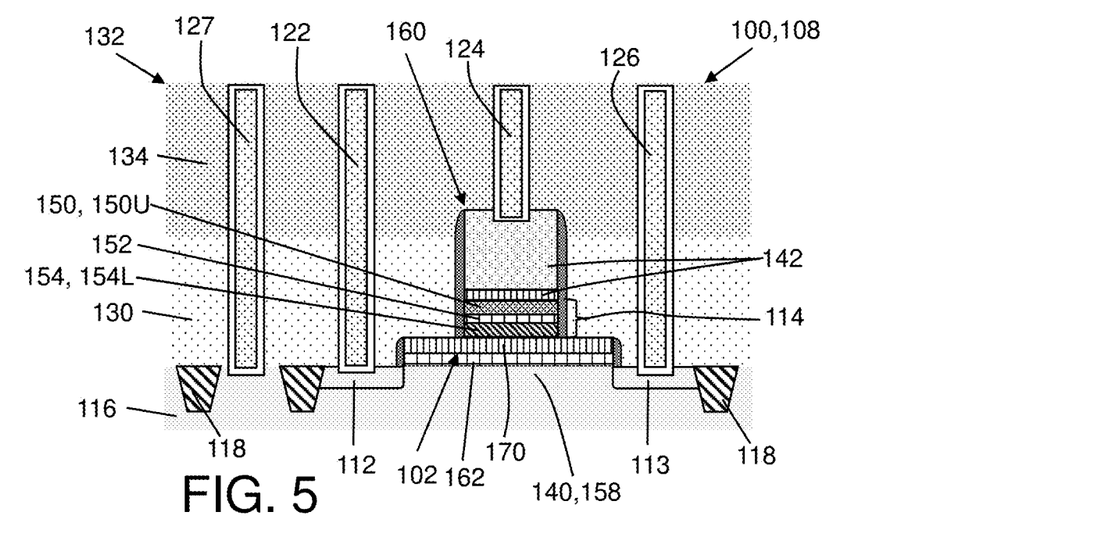
FIG. 5 shows a cross-sectional view of a memory cell in the form of a FeFET similar to that of FIG. 4 and including an additional metal electrode, according to embodiments of the disclosure.

In certain embodiments, shown for example in FIGS. 2 and 4-5, memory cell 100 includes at least one polarization retention member 114 over lower electrode 140. Here, each polarization retention member 114 includes an antiferroelectric layer 150 over and in contact with an interlayer 152 that is over and in contact with a ferroelectric layer 154. Upper metal electrode 142 is over and in contact with an uppermost one 150U of antiferroelectric layer(s) 150. Interlayer 152 may include a dielectric interlayer of a low dielectric band gap material such as but not limited to: titanium oxide ($TiO_2$) or silicon nitride ($Si_3N_4$), but more preferably may include a high dielectric band gap material such as but not limited to: aluminum oxide ($Al_2O_3$) or silicon oxide ($SiO_2$). Alternatively, interlayer 152 may include a metallic interlayer such as but not limited to: titanium nitride (TiN), tantalum nitride (TiN), aluminum (Al), hafnium (Hf), and lanthanum (La).

Interlayer 152 is very thin and may include a single deposition layer having a thickness in the range of, for example, 0.5 Angstroms (Å) to 0.7 Å. FIG. 2 shows a FeRAM 106 including antiferroelectric layer 150 over and in contact with interlayer 152 over and in contact with ferroelectric layer 154. FIGS. 4-5 both show a FeFET 108 including antiferroelectric layer 150 over and in contact with interlayer 152 over and in contact with ferroelectric layer 154. As will be described herein, FeFET 108 in FIG. 5 includes an additional metal electrode 170 under ferroelectric layer 154.

Figure 7:
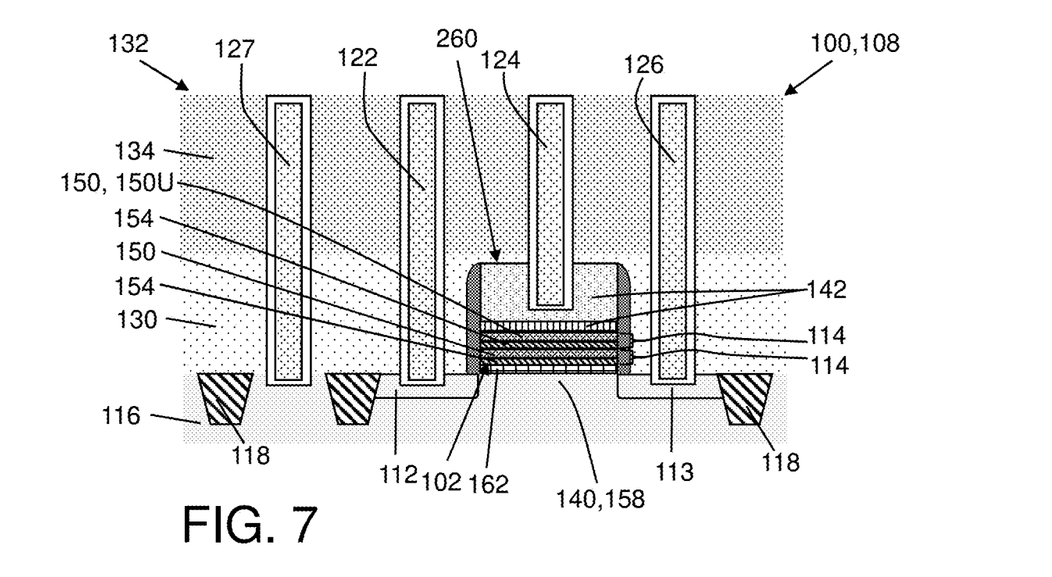
FIG. 7 shows a cross-sectional view of a memory cell in the form of a FeFET including at least a pair of polarization retention members, each including an antiferroelectric layer over a ferroelectric layer, according to additional embodiments of the disclosure.
Figure 8:
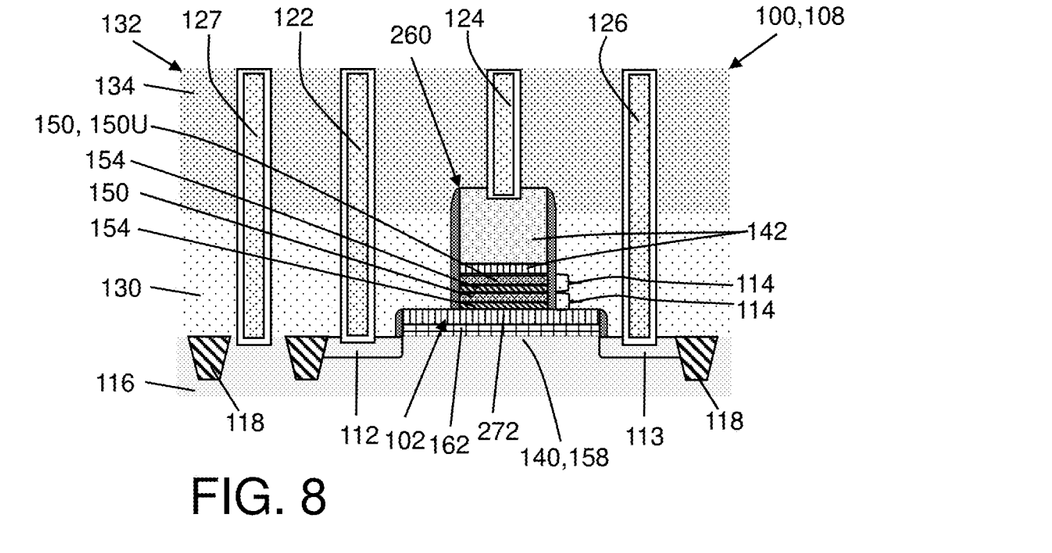
FIG. 8 shows a cross-sectional view of a memory cell in the form of a FeFET similar to FIG. 7 and including an additional metal electrode, according to embodiments of the disclosure.

In other embodiments, shown in FIGS. 3, 7 and 8, memory cell 100 may include at least a pair of polarization retention members 114 over lower electrode 140. Here, each polarization retention member 114 includes antiferroelectric layer 150 over and in contact with ferroelectric layer 154, i.e., with no interlayer. FIG. 3 shows a FeRAM 106 including two polarization retention members 114, each including antiferroelectric layer 150 over and in contact with ferroelectric layer 154. Similarly, FIGS. 7 and 8 show a FeFET 108 including two polarization retention members 114, each including antiferroelectric layer 150 over and in contact with ferroelectric layer 154. In FIGS. 3, 7 and 8, two polarization retention members 114 are shown. However, any number of polarization retention members 114 may be used, e.g., 3, 4 or more, to tailor the antiferroelectric-ferroelectric hysteresis loop. In any event, upper metal electrode 142 is over and in contact with an uppermost one 150U of antiferroelectric layers 150. Upper metal electrode 142 may include one or more layers of gate stack 260, e.g., a work function metal layer and a gate conductor layer.

Referring to FIG. 5, in certain embodiments, FeFET 108 may also include a metal electrode 170 positioned between a lowermost ferroelectric layer 154L and insulator layer 162. Metal electrode 170 may include but is not limited to: titanium nitride (TiN) or tantalum nitride (TaN). Metal electrode 170 and insulator layer 162 may be wider than the rest of gate stack 160, but this is not necessary in all instances.

Figure 6:
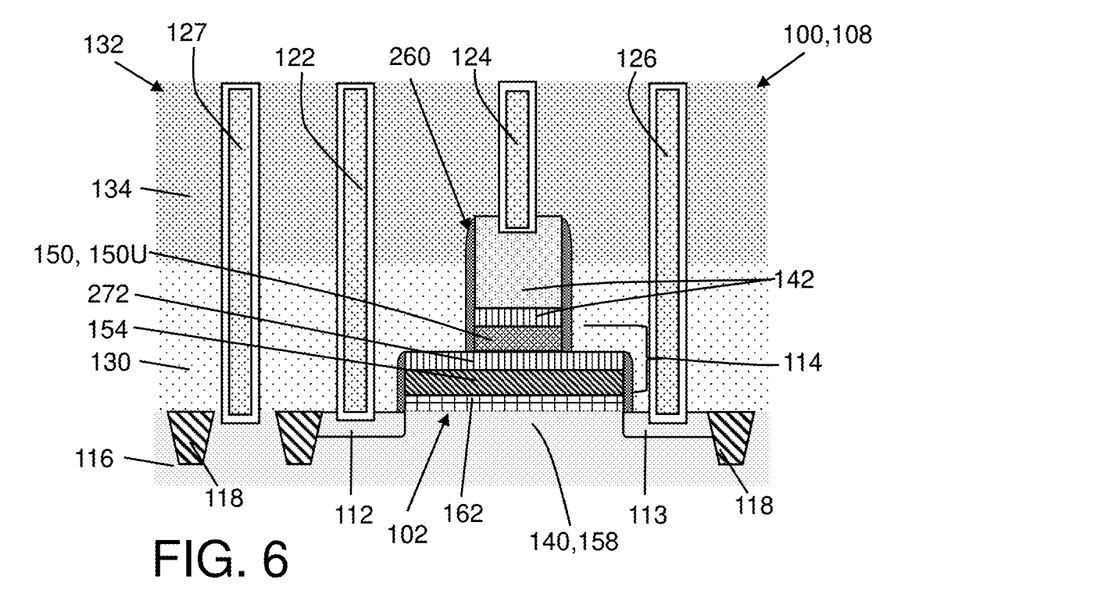
FIG. 6 shows a cross-sectional view of a memory cell in the form of a FeFET including at least one polarization retention member including an antiferroelectric layer over a metal electrode over a ferroelectric layer, according to other embodiments of the disclosure.

Referring to FIGS. 6 and 8, in certain embodiments, FeFET 108 may include source region 112 and drain region 113 in substrate 116, and a gate stack 260. Gate stack 260 may include insulator layer 162 over and in contact with semiconductor substrate 116 between source region 112 and drain region 113, i.e., in contact with channel region 158. Gate stack 260 may also include at least one polarization retention member 114 over insulator layer 162. Here, in contrast to other embodiments, each polarization retention member 114 includes an uppermost antiferroelectric layer 150U, a ferroelectric layer 154 and an additional metal electrode 272. In FIG. 6, additional metal electrode 272 is in between and in contact with uppermost antiferroelectric layer 150U and ferroelectric layer 154. In FIG. 8, ferroelectric layer 154 is under and in contact with uppermost antiferroelectric layer 154U, and additional metal electrode 272 is under and in contact with ferroelectric layer 154. In any event, upper metal electrode 142 is over and in contact with uppermost antiferroelectric layer 150U.

Memory cells 100 may be formed using any now known or later developed IC fabrication techniques. For example, for FeRAM 106, the layers described herein may be formed over FEOL layer(s) 130 or any preceding BEOL layer(s) 134, and patterned to form capacitor structure 102. In one example for the FIG. 2 embodiment, the following layers can be deposited and then patterned: lower metal electrode 140, ferroelectric layer 154, interlayer 152, antiferroelectric layer 150, and upper metal electrode 142. Similarly, for FeFETs 108, the layers described herein may be formed over substrate 116 or any preceding FEOL layer(s) 134, and patterned to form capacitor structure 102, e.g., as part of any gate stack. In one example for the FIG. 4 embodiment, the following layers can be deposited and then patterned: insulator layer 162, ferroelectric layer 154, interlayer 152, antiferroelectric layer 150, and upper metal electrode 142. Upper metal electrode 142 may include, for example, gate work function metal and gate conductor layers. As will be readily recognized by those with skill in the art, formation of memory cell 100 requires minimal additional effort, e.g., deposition of the additional layers described herein, and patterning of the structure(s) as part of conventional processing.

Figure 9:
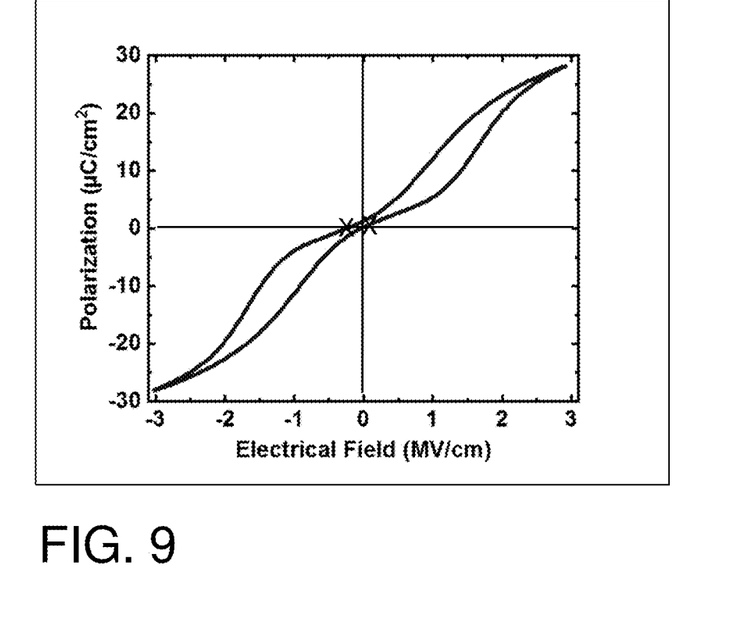
FIG. 9 shows an illustrative graph of an antiferroelectric and ferroelectric PE hysteresis loop, according to embodiments of the disclosure.

Antiferroelectric layer 150 over a metal electrode or ferroelectric layer 154 allows customization of hysteresis loop shape and structure to obtain the desired voltage operation. As described, any of the layers of capacitor structure 102 can be customized to create the desired antiferroelectric and ferroelectric PE hysteresis loop. For example, the type of material, the dopant, dopant concentration, layer thicknesses, and mechanical stress imparted to each layer can be controlled to obtain the desired hysteresis loop. FIG. 9 shows an illustrative graph of an antiferroelectric and ferroelectric PE hysteresis loop, according to embodiments of the disclosure. As illustrated, the use of antiferroelectric layer and the tailoring of that layer, among potentially others, causes the hysteresis loop to be pinched. That is, the coercive electric fields necessary to change polarization states (from positive to negative or vice versa), marked by "X" locations in the hysteresis loop, are at much lower values compared to that of FIG. 1, e.g., much less than 1 MV/cm. Embodiments of the disclosure thus provide a memory cell 100 having lower voltage operation than ferroelectric only FeRAMs and ferroelectric only FeFETs. In addition, memory cell 100 exhibits improved reliability because the coercive electric field is no longer near the break down voltage of the material. As noted, memory cells according to the disclosure can be formed with minimum integration changes.

The memory cells as described above can be used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end-product can be any product that includes integrated circuit chips, ranging from toys and other low-end applications to advanced computer products having a display, a keyboard or other input device, and a central processor.

The terminology used herein is for describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or inter-changed, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A memory cell, comprising:
 a capacitor structure including:
  a first electrode;
  at least a pair of polarization retention members over the first electrode, each polarization retention member including an antiferroelectric layer over and in contact with a ferroelectric layer; and
  a first metal electrode over and in contact with an uppermost one of the antiferroelectric layer.

2. The memory cell of claim 1, wherein the first electrode includes a channel region between a source region and a drain region in a semiconductor substrate; and
 wherein the at least a pair of polarization retention members are part of a gate stack over a first insulator layer over and in contact with the channel region.

3. The memory cell of claim 2, further comprising a second metal electrode between a lowermost ferroelectric layer and the first insulator layer.

4. The memory cell of claim 1, wherein the first electrode includes a metal electrode.

5. The memory cell of claim 1, wherein the ferroelectric layer includes a dopant selected from a group comprised of: silicon (Si), aluminum (Al), lanthanum (La), nitrogen (N), strontium (Sr), gadolinium (Gd), yttrium (Y), or combinations thereof.

6. The memory cell of claim 1, wherein the ferroelectric layer and the antiferroelectric layer are selected from a group comprised of: hafnium oxide ($HfO_2$), zirconium oxide ($ZrO_2$), hafnium zirconium oxide ($Hf_{0.5}Zr_{0.5}O_2$), lead zirconate titanate ($PbZr/TiO_3$)(PZT), barium titanate ($BaTiO_3$) (BTO), lead(II) titanate ($PbTiO_3$), or combinations thereof, and
wherein the ferroelectric layer and the antiferroelectric layer are different.

7. The memory cell of claim 6, wherein at least one of the ferroelectric layer and the antiferroelectric layer includes a dopant selected from a group comprised of: silicon (Si), aluminum (Al), lanthanum (La), nitrogen (N), strontium (Sr), gadolinium (Gd), yttrium (Y), or combinations thereof.

8. The memory cell of claim 7, wherein the antiferroelectric layer includes at least one of: a higher dopant concentration than the ferroelectric layer; a higher mechanical stress than the ferroelectric layer; a thinner thickness than the ferroelectric layer; and where the ferroelectric layer includes zirconium, a higher zirconium (Zr) content than the ferroelectric layer.

9. A memory cell, comprising:
a capacitor structure including:
a first electrode;
at least one polarization retention member over the first electrode, each polarization retention member including an antiferroelectric layer over and in contact with an interlayer over and in contact with a ferroelectric layer; and
a first metal electrode over and in contact with an uppermost one of the antiferroelectric layer.

10. The memory cell of claim 9, wherein the first electrode includes a channel region between a source region and a drain region in a semiconductor substrate; and
wherein the at least one polarization retention member is part of a gate stack over an insulator layer over and in contact with the channel region.

11. The memory cell of claim 10, further comprising a second metal electrode between a lowermost ferroelectric layer and the insulator layer.

12. The memory cell of claim 10, wherein the insulator layer is selected from a group comprised of: silicon oxide ($SiO_2$), silicon oxynitride (SiON), silicon nitride (SiN), aluminum oxide ($Al_2O_3$), or hafnon ($HfSiO_4$).

13. The memory cell of claim 9, wherein the first electrode includes a metal electrode.

14. The memory cell of claim 9, wherein the interlayer has a thickness in a range of 0.5 Angstroms (Å) to 0.7 Å.

15. The memory cell of claim 9, wherein the interlayer includes one of:
a dielectric interlayer selected from a group comprised of: titanium oxide ($TiO_2$), silicon nitride ($Si_3N_4$), aluminum oxide ($Al_2O_3$), silicon oxide ($SiO_2$); and
a metallic interlayer selected from a group comprised of: titanium nitride (TiN), and tantalum nitride (TiN), aluminum (Al), hafnium (Hf), lanthanum (La).

16. The memory cell of claim 9, wherein the ferroelectric layer and the antiferroelectric layer are selected from a group comprised of: hafnium oxide ($HfO_2$), zirconium oxide ($ZrO_2$), hafnium zirconium oxide ($Hf_{0.5}Zr_{0.5}O_2$), lead zirconate titanate ($PbZr/TiO_3$)(PZT), barium titanate ($BaTiO_3$) (BTO), lead(II) titanate ($PbTiO_3$), or combinations thereof,
wherein at least one of the ferroelectric layer and the antiferroelectric layer includes a dopant selected from a group comprised of: silicon (Si), aluminum (Al), lanthanum (La), nitrogen (N), strontium (Sr), gadolinium (Gd), yttrium (Y) or combinations thereof, and
wherein the ferroelectric layer and the antiferroelectric layer are different.

17. The memory cell of claim 16, wherein the antiferroelectric layer includes at least one of: a higher dopant concentration than the ferroelectric layer; a higher mechanical stress than the ferroelectric layer; a thinner thickness than the ferroelectric layer; and where the ferroelectric layer includes zirconium, a higher zirconium (Zr) content than the ferroelectric layer.

18. A ferroelectric field effect transistor (FeFET), comprising:
a source region and a drain region in a semiconductor substrate;
a gate stack including:
a first insulator layer over and in contact with the semiconductor substrate between the source region and the drain region,
at least one polarization retention member over the first insulator layer, each polarization retention member including an uppermost antiferroelectric layer, a ferroelectric layer and a first metal electrode; and
a second metal electrode over and in contact with the uppermost antiferroelectric layer.

19. The FeFET of claim 18, wherein the first metal electrode is in between and in contact with the uppermost antiferroelectric layer and the ferroelectric layer.

20. The FeFET of claim 18, wherein the ferroelectric layer is under and in contact with the uppermost antiferroelectric layer and the first metal electrode is under and in contact with the ferroelectric layer.

* * * * *

UNITED STATES PATENT AND TRADEMARK OFFICE
CERTIFICATE OF CORRECTION

PATENT NO. : 11,889,701 B2
APPLICATION NO. : 17/237886
DATED : January 30, 2024
INVENTOR(S) : Tarek Ali et al.

It is certified that error appears in the above-identified patent and that said Letters Patent is hereby corrected as shown below:

On the Title Page

Item (73), the listed Assignee GlobalFoundries U.S. Inc., should be "GLOBALFOUNDRIES Dresden Module One Limited Liability Company & Co KG."

Signed and Sealed this
Twenty-sixth Day of March, 2024

Katherine Kelly Vidal
*Director of the United States Patent and Trademark Office*